United States Patent [19]

Bourke et al.

[11] 4,258,306
[45] Mar. 24, 1981

[54] STATE OF BATTERY CHARGE INDICATOR CIRCUIT

[75] Inventors: Robert F. Bourke, Kamiah, Id.; David K. Johansen, Lake-in-the-Hills, Ill.

[73] Assignee: Gould Inc., Rolling Meadows, Ill.

[21] Appl. No.: 943,629

[22] Filed: Sep. 19, 1978

[51] Int. Cl.³ .............................................. H02J 7/00
[52] U.S. Cl. ...................................... 320/48; 320/43; 340/636
[58] Field of Search .......................... 320/43, 39, 48; 324/29.5; 340/636

[56] References Cited

U.S. PATENT DOCUMENTS

| | | | |
|---|---|---|---|
| 3,568,175 | 3/1971 | Schwehr et al. | 320/48 X |
| 3,939,421 | 2/1976 | Barringer et al. | 320/48 X |
| 3,946,299 | 3/1976 | Christianson et al. | 320/43 |
| 4,017,724 | 4/1977 | Finger | 320/48 X |
| 4,019,112 | 4/1977 | Satoh | 320/48 |

Primary Examiner—Robert J. Hickey
Attorney, Agent, or Firm—Wegner, Stellman, McCord, Wood & Dalton

[57] ABSTRACT

An indicator circuit for indicating to the operator of an electrically propelled vehicle the remaining capacity of the vehicle battery. The state of charge information is indicated in digital form for facilitated readout. The circuit is arranged to prevent an increase in the indicated state of charge during use of the battery as a power source, i.e. in a motoring mode. The circuit is arranged to prevent a decrease in the indication of the state of charge during a recharging of the battery. The circuit utilizes a feedback signal from the digital counter portion thereof for comparison with a second signal produced in the control circuit to provide either a count-up signal to the digital counter or a count-down signal to the digital counter in providing the control of the operator indicator. The feedback signal may be converted to an analogue signal for comparison with the produced circuit signal in a comparator to provide the appropriate count-up or count-down signal. A fast count control may be provided for bringing the indicator quickly to the actual state of charge reading upon initiating use of the vehicle in the motoring mode. The circuit is arranged to prevent the indicator from reading out less than zero percent state of charge when the battery is being used as the power source and more than one hundred percent state of charge during the recharging operation.

23 Claims, 1 Drawing Figure

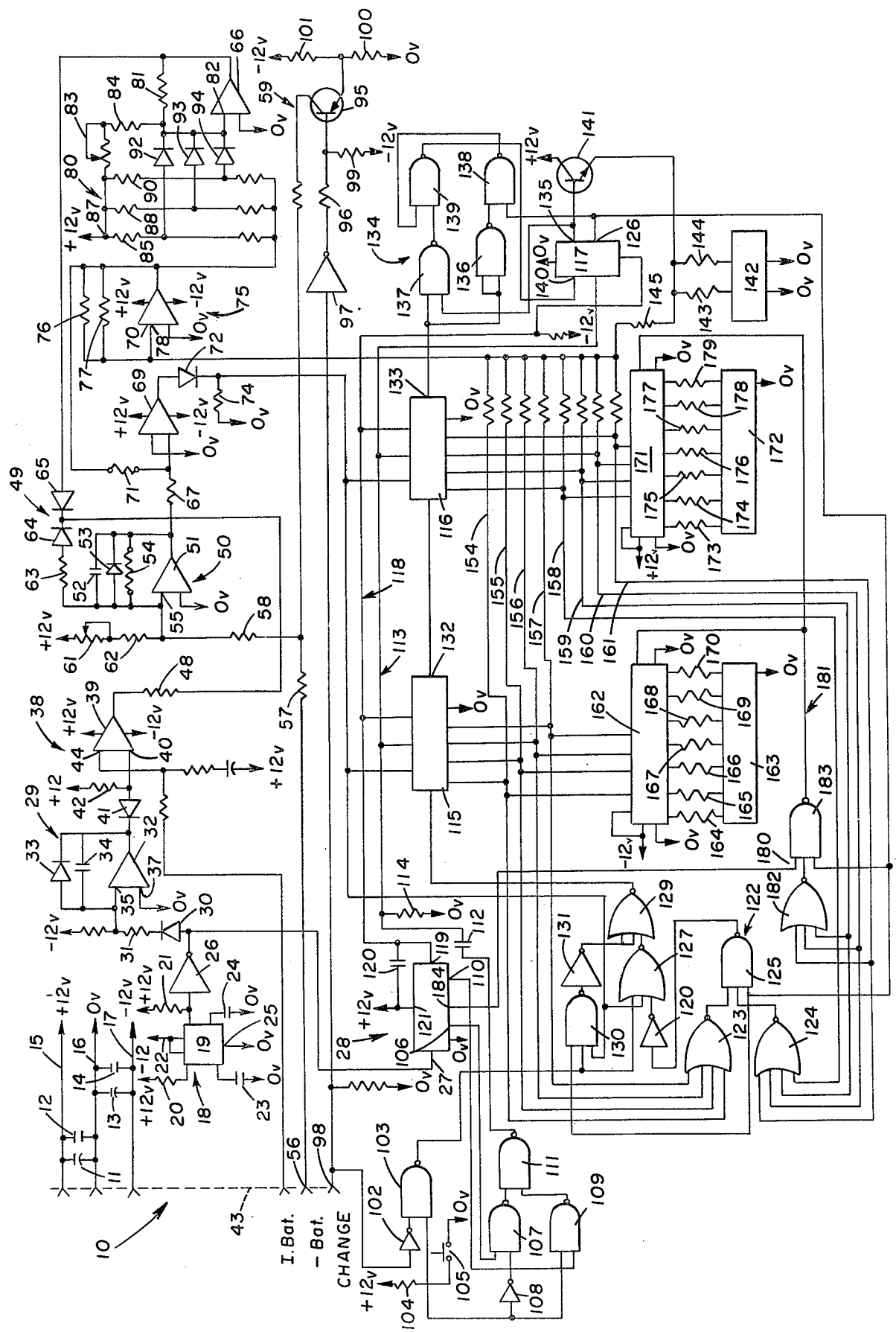

STATE OF BATTERY CHARGE INDICATOR CIRCUIT

BACKGROUND OF THE INVENTION

1. Field of the Invention

This invention relates to electrically propelled vehicles and in particular to means for indicating the actual state of charge in the drive batteries of the vehicle.

2. Description of the Prior Art

In U.S. Pat. No. 4,008,423 of Clinton C. Christianson et al, which patent is owned by the assignee hereof, an improved electrically propelled vehicle is disclosed having a direct current drive motor operated from a propulsion battery of the vehicle. The vehicle is adapted to be operated both at low speed and high speed by different modes of operation of the motor.

Robert F. Bourke, in U.S. Pat. No. 3,938,020, which patent is owned by the assignee hereof, discloses a charger circuit for an accessory battery in such an electrically propelled vehicle.

Clinton C. Christianson et al, in U.S. Pat. No. 3,958,173, which patent is owned by the assignee hereof, disclose a power converter employing non-saturating interphase transformer means for providing an output voltage having a level controlled in response to an external control signal.

In U.S. Pat. No. 3,946,299, owned by the assignee hereof, Clinton C. Christianson et al disclose a battery state of charge gauge including an improved circuit for detecting and indicating the actual state of charge of the storage battery of the vehicle. The gauge circuit includes means for calculating the open circuit voltage of the battery and a function generator simulating the characteristic curve of the battery internal resistance relative to the state of charge of the battery. The circuit further includes means for providing a signal proportional to the battery current. The various signals are combined to produce an output signal corresponding to the actual state of charge of the battery. The circuit includes means for effecting an expanded scale voltmeter functioning so as to provide facilitated indicating of the state of charge to the vehicle operator.

It has further been conventional to utilize coulometers for integrating the battery current over relatively long time intervals, such as a plurality of hours, so as to measure the ampere hours withdrawn from and returned to the battery during the motoring and recharging modes, respectively. Such prior art circuits do not provide an accurate determination of the state of charge of the battery as they do not effectively take into consideration variable factors, such as the rate of discharge and the like.

Another approach to the problem has been to utilize the open circuit voltage of the battery. This method of state of charge determination, however, presents a serious disadvantage of requiring that the indication must be made when the battery current is zero and, thus, may not be utilized during normal operation of the vehicle. Further, because of the relatively small change in terminal voltage corresponding to substantial change in the state of charge of the battery requiring the use of expanded scale voltmeters or the like, the prior art structures utilizing such state of charge determination means are relatively expensive and complicated.

SUMMARY OF THE INVENTION

The present invention comprehends an improved circuit for indicating the actual state of charge of a storage battery of an electrically propelled vehicle or the like. More specifically, the indicator circuit of the present invention provides means for effectively preventing false indications of the battery state of charge such as may arise upon interruption of the use of the battery in a motoring mode or interruption in the recharging of the battery in the recharging operation.

The indicating circuitry of the present invention provides an effectively positive indication of the actual state of charge of the battery by correlating a number of parameters in a novel manner and utilizing feedback signals to assure accurate correlation of the battery state of charge with the indicating means.

In the indicator circuit of the present invention, digital counter means are utilized for providing a digital read-out of the actual battery state of charge in the form of a reading of percentage of battery capacity remaining. The circuit is arranged to permit the indication to decrease to zero during the motoring mode and to increase to one hundred percent in the recharging mode. Disabling means are incorporated in the circuit to prevent the readout from going below zero and above one hundred percent.

The improved control circuit converts the count of the digital counters to an analogue signal which is compared with the output signal produced by combining a battery current signal, an internal resistance signal, and a terminal voltage signal so as to provide the appropriate count-up or countdown signal to the digital counters. Disabling means are provided for preventing a count-up signal produced by the signal from being applied to the digital counter when the battery is in the motoring mode, i.e. being used as the power source of the vehicle. Disabling means are provided for preventing a countdown signal from the comparator being applied to the digital counters when the system is in the recharging mode.

The digital counters may be utilized to indicate the actual state of battery charge in conventional digital readout displays for further improved indication of the battery state of charge to the vehicle operator.

Thus, the indicator circuitry of the present invention provides, at all times, an accurate indication of the actual state of charge of the vehicle battery. The circuit prevents a false indication as may occur where the battery is allowed to rest while being utilized in the motoring mode, as would result from the temporary increase in the terminal voltage of the battery immediately following such rest period. The circuit further prevents false indications such as may arise during regenerative braking when a temporary recharging of the battery occurs. It is most important to provide an accurate indication of the actual state of charge of the battery to the operator to avoid giving false information as to the remaining capacity of the battery. Where such false temporary indications have been permitted in the prior art structures, it has been found that the operator's confidence in the utilization of the state of charge indicator is reduced, thereby presenting problems in the efficient utilization of the electrically propelled vehicle.

In providing a state of charge reading during the recharging of the battery, further improved control of the utilization of the battery means is afforded. In the recharging mode, the state of charge signal is made to be dependent primarily on the battery terminal voltage which is compared with the particular charge profile of the battery so as to provide a substantially accurate indication of the actual state of charge of the battery during such recharging operations. The circuit includes an expanded scale voltmeter portion to shift the range to more accurately correlate the terminal voltage of the battery with the charge profile in indicating the actual state of charge during the recharging operation.

The indicator circuitry of the present invention is extremely simple and economical of construction while yet providing highly desirable advantages and features over the prior art indicator means as discussed above.

BRIEF DESCRIPTION OF THE DRAWING

Other features and advantages of the invention will be apparent from the following description taken in connection with the accompanying drawing wherein the single FIGURE is a schematic wiring diagram of an improved indicator control circuit embodying the invention.

DESCRIPTION OF THE PREFERRED EMBODIMENT

In the exemplary embodiment of the invention as disclosed in the drawing, a circuit for indicating a battery state of charge is shown to include a power supply generally designated 10. The power supply includes a filter comprising a parallel combination of capacitors 11 and 12 and a second parallel combination of capacitors 13 and 14 to provide +12 v on line 15, 0 v on line 16 and −12 v on line 17.

The circuit further includes an oscillator generally designated 18 comprising an astable multivibrator 19 that determines a basic clock rate for the system. Multivibrator 19 is connected to +12 v on line 15 through a resistor 20, a resistor 21, and a line 22. The multivibrator 19 is also connected to 0 v on line 16 through a capacitor 23, a capacitor 24, and a line 25. The output of the multivibrator 19 is connected through an inverter 26 to a clock input terminal 27 of a buffer counter 28.

The output of the multivibrator 18 is also connected to a ramp generator generally designated 29 through the inverter 26, a diode 30 and a resistor 31. The ramp generator 29 comprises an operational amplifier 32 and a parallel combination of a diode 33 and a capacitor 34 connected across the output of amplifier 32 and its inverting input 35. The inverting input 35 of amplifier 32 is connected between resistor 31 leading from oscillator 18 and a resistor 36 leading from −12 v on line 17. The noninverting input 37 of amplifier 32 is connected to 0 v on line 16.

A duty cycle stage generally designated 38 comprises an operational amplifier 39, the noninverting input 40 of which is connected to amplifier 32 through a diode 41 and is connected to +12 v on line 15 through a resistor 42. A battery current shunt signal 43 is input to the inverting terminal 44 of amplifier 39 through a time delay circuit comprising a resistor 45 and a seires combination of a resistor 46 and a capacitor 47 connected to −12 v on line 17. The output of amplifier 39 is connected through a resistor 48 to an analogue switch 49 of an expanded scale voltmeter circuit generally designated 50.

The expanded scale voltmeter 50 comprises an operational amplifier 51 and a parallel combination of a capacitor 52, a diode 53 and a resistor 54 connected across the output of amplifier 51 and the amplifier's inverting input 55. There are four input signals to the expanded scale voltmeter. A -Batt signal 56 is connected to input 55 through a resistor 57 and a resistor 58. A signal from a change mode range stage generally designated 59 is connected to input 55 through a resistor 60 and resistor 58. A third input signal to input 55 is from −12 v on line 15 through a variable resistor 61 and a resistor 62. A fourth signal is input to terminal 55 through a resistor 63 from the analogue switch 49 comprising a pair of diodes 64 and 65. The output of the duty cycle 38 as previously described is connected between diodes 64 and 65, and the output from an operational amplifier 66 is also connected to switch 49 through diode 65.

The output of the expanded scale voltmeter is connected through a resistor 67 to the noninverting input 68 of an up/down comparator 69. The output of an operational amplifier 70 is also connected through a resistor 71 to terminal 68 of the comparator 69, the output of which is connected through a diode 72 to a line 73 and to 0 v on line 16 through a resistor 74.

A state of charge in the counter circuit generally designated 75 comprises the operational amplifier 70 and a parallel combination of two resistors 76 and 77 connected across the output of amplifier 70 and its inverting input 78. An analgoue signal from a resistor network generally designated 79 is input to the amplifier 70 at terminal 78. The output of amplifier 70 is connected to the up/down comparator 69 as previously described, and it is also connected to an internal battery impedance circuit, generally designated 80.

The internal battery impedance circuit 80 comprises operational amplifier 66 with a feedback resistor 81 connected across the output of amplifier 66 and its inverting input terminal 82. A variable resistor 83 and a resistor 84 are connected in series between +12 v on line 15 and terminal 82 to amplifier 66. A series combination of resistors 85 and 86 is connected between a junction 87 and the output terminal of amplifier 70. A series combination of resistors 88 and 89 and a series combination of resistors 90 and 91 are similarly connected in parallel between junction 87 and the output of amplifier 70. A diode 92 is connected to terminal 82 of amplifier 66 and between resistors 85 and 86. A second diode 93 is similarly connected to terminal 82 and between resistors 88 and 89 as is a third diode 94 connected between resistors 90 and 91.

The charge mode range circuit 59 comprises a pnp transistor 95, the base of which is connected through a resistor 96 to an inverter 97. Input to inverter 97 is a charge signal designated 98. A resistor 99 is connected between resistor 96 and the base of transistor 95 to −12 v on line 17. The emitter of transistor 95 is connected between a resistor 100 leading to 0 v on line 16 and a resistor 101 leading to −12 v on line 17. The collector of transistor 95 is connected to the expanded scale voltmeter 50 through resistors 60 and 58, as previously described.

The charge signal 95 is input to the counter stage of the battery state of charge indicator circuit through an inverter 102 which is connected to a NAND gate 103. The second input to NAND gate 103 is from +12 v through a resistor 104. A fast count service switch 105 is connected through resistor 104 to +12 v and is also connected to 0 v. Switch 105 allows the counters to count at a fast rate to reset the counters if the battery has been disconnected and then reconnected.

The buffer counter 28 has an input 27 from the oscillator 18 and output at a terminal 106 to a NAND gate 107. A second input to NAND gate 107 is from +12 v through an inverter 108. A NAND gate 109 has one input from +12 v and a second input from an output terminal 110 of the buffer counter 28. The outputs of NAND gates 107 and 109 are connected to a NAND gate 111. The output of NAND gate 111 is connected through a capacitor 112 to a line 113 which is connected to 0 v through a resistor 114. Line 113 provides clocked inputs from buffer counter 28 to a ones counter 115, a tens counter 116 and a flip-flop 117 which is the hundreds overlow gate.

A reset signal is provided on line 118 leading from a terminal 119 of buffer counter 28 to the ones counter 115, tens counter 116 and hundreds flip-flop 117. A capacitor 120 is connected to line 118 and between +12 v and an input terminal 121 of buffer counter 28.

An all zeros circuit generally designated 122 comprises two NOR gates 123 and 124 and a NAND gate 125. Outputs from the ones counter 115 are input to NOR gate 123 and outputs from the tens counter 116 are input to NOR gate 124. The outputs from NOR gates 123 and 124 are input to NAND gate 125 as is the output from a terminal 126 of the hundreds flip-flop 117.

The output from NAND gate 125 is connected to the input of a NOR gate 127 through an inverter 128. A second input to NOR gate 127 is taken from the output of NAND gate 103. Line 73 leading from the up/down comparator is the third input to NOR gate 127, the output of which is connected to a NOR gate 129. The second and third inputs to NOR gate 129 are connected from the output of a NAND gate 130 through an inverter 131. The inputs to NAND gate 130 comprise a signal from NAND gate 103, a signal from the up/down comparator 69 on line 73 and a signal from terminal 126 of the hundreds flip-flop 117.

The output of NOR gate 129 connected to the input of the ones counter 115 determines whether the counters will count up or count down. A carry out signal from terminal 132 of ones counter 115 is connected to the input of the tens counter 116 and the carry out signal from terminal 133 of tens counter 116 is connected to the logic circuitry of the hundreds overlow gate generally designated 134.

The hundreds overflow gate 134 comprises flip-flop 117, the output of which is connected from a terminal 135 to the input of a NAND gate 136. The output of tens counter 116 at terminal 133 is connected to the input of NAND gate 136 and is also connected to the input of a NAND gate 137. The output of NAND gate 137 is connected to the input of a NAND gate 138 as is the output of the hundreds flip-flop 117 from terminal 126. The outputs of NAND gate 138 and NAND gate 136 are input to a NAND gate 139, the output of which is fed back to an input 140 of flip-flop 117.

The output of flip-flop 117 at terminal 135 is connected to the base of an npn transistor 141, the collector of which is connected to +12 v. The emitter of transistor 141 is connected to an overflow display 142 through a parallel combination of resistors 143 and 144. The emitter of transistor 141 is also connected to the resistor network 79 through a resistor 145.

The resistor network 79 is a BCD-to-analogue converter comprising the resistors 146 through 153. As previously described, the output from the hundreds flip-flop 117 is connected to the resistor network 70 through resistor 145. The output of the ones counter 115 is connected to the resistor network 79 on lines 154 through 157, and the output of the tens counter 116 is connected to resistor network 79 on lines 158 through 161. The output of the resistor network is then connected to the up/down comparator 70.

The outputs of the ones counter on lines 154 through 157 are connected to a decoder/driver 162 which decodes these outputs and drives a ones display 163 which is connected to the decoder/driver 162 through resistors 164 through 170. Similarly, the outputs and drives of the tens counter on lines 158 through 161 are connected to a decoder/driver 171 which decodes the counter outputs and drives a tens display 172 connected to the decoder driver 171 through resistors 173 through 179.

The output from an inhibit count circuit generally designated 180 is also input to the ones and tens counter from a line 181. The inhibit count circuit 180 comprises a NOR gate 182, the inputs of which are lines 159, 160 and 161. The output of NOR gate 182 is connected to the input of a NAND gate 183. A second input of NAND gate 183 is taken from the output of buffer counter 28 at a terminal 184 and a third input from the output of flip-flop 117 at terminal 126.

The above described circuit provides an accurate digital display of the battery state of charge calculated by both analogue and digital circuitry. The digital circuitry in particular prevents counting up during motoring and counting down during charging which could lead to a misleading state of charge indication.

During the operation of the battery state of charge indicator, the oscillator 18 provides the basic counting rate for the system. The value of resistor 20 determines the frequency of oscillator 18 and is selected so that the output of the duty cycle stage 38 is +12 v, 0 v and −12 v for zero percent, fifty percent and one hundred percent duty cycle, respectively.

The ramp generator stage 29 generates a positive going ramp from −0.6 to +10 volts over a period of time, approximately 5.6 msec. The generated ramp which is fed to the noninverting input 40 of amplifier 39 provides a means of modulating the width of the duty cycle pulses.

The duty cycle stage 38 generates a pulse having a width that is proportional to the magnitude of the battery current. For example, if the battery current is 500 amperes, the output of amplifier 39 is one hundred percent duty cycle of −12 v. For a battery current of 250 amperes, the output is fifty percent duty cycle, or 0 volts, and at zero battery current, the output is zero percent duty cycle or +12 volts.

The amplifier 39 of the duty cycle 38 operates such that its output is +12 volts when the difference between the positive going ramp from ramp generator 29 and the voltage level representing the battery current is positive, and the output from amplifier 39 is −12 volts when the difference is negative. If the battery is in charge mode, the battery current is zero, or negative, the output of amplifier 39 is always +12 volts, and the analogue switch 49 is turned off, which eliminates the input through resistor 63 to the expanded scale voltmeter 50. When the battery is in the motoring mode, the output of amplifier 39 is −12 volts which turns the analogue switch 49 on and the battery IR drop through resistor 63 is provided as an input to the expanded scale voltmeter 50.

When the vehicle accelerator pedal is selectively released or depressed, the battery current may change substantially instantaneously. However, the battery voltage does not correspondingly change instantaneously as diffusion of the battery electrolyte through the plates of the battery requires a finite period of time. Thus, a voltage drop equal to the battery current times the battery impedance is seen when the load is first applied. However, after a time period, the battery voltage drops further although the current may remain unchanged, because of depletion of electrolyte ions on the battery plate surface. When the load is removed, an instantaneous recovery of the battery voltage is seen, and if the state of charge of the battery is measured upon such removal of the load, the reading will tend to increase. However, in the present control circuitry, the meter cannot follow this false temporary state of charge signal because the counters are disabled from counting up during the motoring mode. Further, the time delay circuit, comprising resistors 45 and 46 and capacitor 47 connected to the battery current input at terminal 44 of amplifier 39, provide a time constant in a time delay circuit approximately equal to the time period during which the battery voltage drops when the load is first applied to avoid the temporary false state of charge signal indication.

The expanded scale voltmeter 50 generates an analogue signal that is proportional to the open circuit battery voltage. The scale expansion factor is about 10:1 in the motoring mode. The output of the charge mode range stage 59 is utilized to shift the expanded scale voltmeter 50 so that it correlates terminal voltage with the charge profile to indicate the battery state of charge during charging. In the charging mode, the battery current is ignored and the battery voltage is measured at a terminal 185.

The input to the expanded scale voltmeter 50 from +12 volts through resistors 61 and 52 produces an offset which prevents amplifier 51 from slewing positive until the battery open-circuit voltage exceeds a set value. The variable resistor 61 is used to adjust the offset upward or downward.

The output from amplifier 39, representing battery current or duty cycle, and the output from amplifier 66, representing the battery resistance, are multiplied together to produce the battery IR drop which is input to the expanded scale voltmeter 50 during motoring.

The up/down comparator 69 is utilized to compare the digital-to-analogue converted signal from the counter stage on lines 154 through 161 to the analogue signal from the expanded scale voltmeter 50. Comparator 69 then determines whether the counter 115 should count up or down, and sends a signal to the all-zero circuit 122 and the inhibit count circuit 180 which prevents the counter from counting up during motoring or down during charging. If the signal from amplifier 51 is lower than that from amplifier 70 and the system is in the motoring mode, the circuit will count down. If the signal from amplifier 51 is higher than that from aplifier 70 and the system is in the charging mode, the circuit will count up.

The state of charge in counter circuit 75 generates an analogue signal which is proportional to the state of charge determined by the counters 115, 116 and 117 and the binary decade weighted resistor network 79. The signal thus generated is the analogue voltage input to comparator 69 and the battery impedance circuit 80.

The purpose of the battery impedance circuit 80 is to synthesize an analogue curve that represents the battery internal impedance as a function of the state of charge. When multiplied by the battery current from amplifier 39, the signal represents the internal voltage battery and is used to calculate the open circuit battery voltage in the expanded scale voltmeter 50. This circuit, comprising resistors 83 through 91, diodes 92 through 94 and amplifier 66, is actually a four-slope function generator.

The fast count service switch 105 is provided to make the counters count at a fast rate and to reset them if the battery has been disconnected and then reconnected for servicing. This becomes necessary since the counters 115 and 116 and flip-flop 117 are reset to zero when +12 volts control power is turned on. The switch 105, as shown, is a single-pole normally open, momentary action, pushbutton type. When switch 105 is actuated, the up count during the motoring inhibit is defeated and the output of buffer counter 28 at terminal 106 is fed to the clock inputs of counters 115 and 116 and the flip-flop 117. When the switch is released, the up count during motoring inhibit is enabled and the output of buffer counter 28 at terminal 110 is fed to counters 115 and 116 and flip-flop 117.

Buffer counter 28 is provided to reduce the counting rate as generated by oscillator 18 before the count pulses are fed to the counters. The counting rate is reduced by a much smaller factor when the fast count switch is actuated than during normal operation.

The counters 115 and 116 and the flip-flop 117 count pulses from the buffer counter 28. The output of the counters and flip-flop is BCD and is fed to decoder/drivers 162 and 171 where it is decoded and used to drive the displays 163 and 164 for the ones and tens digits, respectively. The hundreds display 142 is either blank when the percent state of charge is less than one hundred percent, or one when it equals one hundred percent.

The binary decade weighted resistor network 79 is a BCD-to-analogue converter which feeds an analogue signal that is proportional to the state of charge, to amplifier 70 which, in turn, feeds the signal to up/down comparator 69 to determine whether the counters should count up or down.

The all zeros circuit 122 prevents counting down when counters 115 and 116 are zero and the hundreds count from flip-flop 117 is not one. Therefore, it prevents the system from counting below zero percent.

The inhibit count circuit 180 permits counting up only when the system is in the charge mode and counting down only when in the motoring mode. Circuit 180 also stops the counters when one hundred percent is reached, that is, when the output of flip-flop 117 is one.

The counting rate determined by oscillator 18 is preferably only somewhat faster than the maximum rate of discharge of the battery so as to follow the actual state of charge of the battery to not allow momentary discrepancies in the battery parameters to affect the readout. Illustratively, in one embodiment of the inverter, the clock rate was set by resistor 20 to be one hundred counts in approximately 53 minutes where the battery comprised conventional lead acid vehicle drive battery.

Another advantageous feature of the control is an early warning indication resulting from an intermittent operation of the ones and tens displays 163 and 172 when the tens count goes below two. Thus, whenever the actual state of charge goes below 20 percent, a blinking of these displays warns the vehicle operator of the condition. More specifically, the buffer counter signal from output 184 delivered to NAND gate 183 is caused to blink the ones and tens displays when enabled through NOR gate 182.

The foregoing disclosure of specific embodiments is illustrative of the broad inventive concepts comprehended by the invention.

We claim:

1. In a circuit for indicating the actual state of charge of a storage battery including means for providing a first signal proportional to battery current, means for producing a second signal proportional to the internal resistance of the battery at its actual state of charge, means for providing a third signal proportional to the actual terminal voltage of the battery, means for combining said signals to produce an output signal proportional to the actual state of charge, and converting means for converting the output signal to an indication of the actual state of charge of the battery, the improvement comprising:
disabling means for preventing the converting means from indicating an increase in the state of charge during use of the battery as a power source.

2. The indicating circuit of claim 1 further including second disabling means for preventing the converting means from indicating a decrease in the state of charge during a recharging operation.

3. The indicating circuit of claim 1 wherein said output signal converting means includes a digital readout means.

4. The indicating circuit of claim 1 wherein said converting means includes a digital counter and said disabling means comprises means for preventing the counter from counting up during use of the battery as a power source.

5. The indicating circuit of claim 1 further including second disabling means for preventing the converting means from indicating a decrease in the state of charge during a recharging operation, said converting means including a digital counter, said first named disabling means comprising means for preventing the counter from counting up during use of the battery as a power source, and said second disabling means comprising means for preventing the counter from counting down during a recharging operation.

6. The indicating circuit of claim 1 further including means for selectively disabling the disabling means when desired.

7. The indicating circuit of claim 1 wherein said converting means includes a digital counter and said disabling means comprises means for preventing the counter from counting up during use of the battery as a power source, said circuit further including means for selectively disabling the disabling means and effecting an accelerated count-up operation of the converting means when desired.

8. In a circuit for indicating the actual state of charge of a storage battery including means for providing a first signal proportional to battery current, means for producing a second signal proportional to the internal resistance of the battery at its actual state of charge, means for providing a third signal proportional to the actual terminal voltage of the battery, means for combining said signals to produce an output signal proportional to the actual state of charge, and converting means for converting the output signal to an indication of the actual state of charge of the battery, the improvement comprising
disabling means for preventing the converting means from indicating a decrease in the state of charge during a recharging operation.

9. The indicating circuit of claim 8 wherein said converting means includes a digital counter and said disabling means comprises means for preventing the counter from counting down during the recharging operation.

10. In a circuit for indicating the actual state of charge of a storage battery including means for producing a first signal proportional to battery current, means for producing a second signal proportional to the internal resistance of the battery at its actual state of charge, means for producing a third signal proportional to the actual terminal voltage of the battery, and means for combining said signals to produce an output signal proportional to the actual state of charge, the improvement comprising
converting means for converting the output signal to an indication of the actual state of charge of the battery including means for producing a feedback signal and comparator means for comparing said output signal and said feedback signal to control said actual state of charge indication.

11. The indicating circuit of claim 10 wherein said converting means further includes a digital counter means providing said feedback signal corresponding to the actual state of charge, and said comparator means is arranged to provide a countdown signal when the feedback signal is less than said output signal and a count-up signal when the feedback signal is greater than said output signal.

12. The indicating circuit of claim 10 wherein said converting means further includes a digital counter means providing said feedback signal corresponding to the actual state of charge, and said comparator means is arranged to provide a countdown signal when the feedback signal is less than said output signal and a count-up signal when the feedback signal is greater than said output signal, and means for preventing the digital counter means from counting up during use of the battery as a power source notwithstanding the provision of a count-up signal from the comparator means.

13. The indicating circuit of claim 10 wherein said converting means further includes a digital counter means providing said feedback signal corresponding to the actual state of charge, and said comparator means is arranged to provide a countdown signal when the feedback signal is less than said output signal and count-up signal when the feedback signal is greater than said output signal, and means for preventing the digital counter means from counting down during a recharging operation notwithstanding the provision of a countdown signal from the comparator means.

14. In a circuit for indicating the actual state of charge of a storage battery including means for providing a first signal proportional to battery current, means for producing a second signal proportional to the internal resistance of the battery at its actual state of charge, means for providing a third signal proportional to the actual terminal voltage of the battery, means for combining said signals to produce an output signal proportional to the actual state of charge, and converting means for converting the output signal to an indication of the actual state of charge of the battery, the improvement comprising
disabling means for preventing the converting means from indicating a state of charge outside the range of zero to one hundred percent.

15. The indicating circuit of claim 14 wherein said converting means includes a digital counter means and said disabling means prevents the counter means from counting down to below zero during use of the battery as a power source.

16. The indicating circuit of claim 14 wherein said converting means includes a digital counter means and said disabling means prevents the counter means from counting up to above one hundred during a battery recharging operation.

17. In a circuit for indicating the actual state of charge of a storage battery including means for providing a first signal proportional to battery current, means for producing a second signal proportional to the internal resistance of the battery at its actual state of charge, means for providing a third signal proportional to the actual terminal voltage of the battery, and means for combining said signals to produce an output signal proportional to the actual state of charge, the improvement comprising:

a comparator;

means for feeding said output signal to the comparator;

digital counter means; and feedback means for providing a feedback signal from the digital counter means to the comparator for comparison therein with said output signal to produce a count-down signal when the feedback signal is less than said output signal and a count-up signal when the feedback signal is greater than said output signal.

18. The indicating circuit of claim 17 wherein said output signal comprises an analogue signal and said feedback signal comprises an analogue signal proportional to the count appearing in the digital counter means.

19. The indicating circuit of claim 17 further including digital readout means for displaying the count of the digital counter means.

20. The indicating circuit of claim 17 further including digital readout means for displaying the count of the digital counter means only within a range of zero to one hundred percent.

21. The indicating circuit of claim 17 further including means for preventing the count-up signal from being delivered to the digital counter means during use of the battery as a power source.

22. The indicating circuit of claim 17 including time delay means for disabling the means for producing said first signal for a preselected period of time after the battery is placed in the power source mode thereby to preclude a false exaggerated indication of the battery actual state of charge.

23. The indicating circuit of claim 17 including an expanded scale voltmeter circuit portion for use in providing said output signal during recharging of the battery.

* * * * *